United States Patent [19]
Sandhu et al.

[11] Patent Number: 5,888,295
[45] Date of Patent: Mar. 30, 1999

[54] METHOD OF FORMING A SILICON FILM

[75] Inventors: Gurtej S. Sandhu; Randhir P.S. Thakur, both of Boise, Id.

[73] Assignee: Micron Technology, Inc., Boise, Id.

[21] Appl. No.: 699,826

[22] Filed: Aug. 20, 1996

[51] Int. Cl.[6] ............... H01L 21/205; H01L 21/285; H01L 21/324; C30B 28/14
[52] U.S. Cl. ............... 117/89; 438/398; 438/964; 438/486; 438/491
[58] Field of Search .............. 117/89; 438/398, 438/486, 491, 964

[56] References Cited

U.S. PATENT DOCUMENTS

| | | | |
|---|---|---|---|
| 5,191,509 | 3/1993 | Wen | 361/311 |
| 5,266,514 | 11/1993 | Tuan et al. | 437/52 |
| 5,326,722 | 7/1994 | Huang | 438/399 |
| 5,342,800 | 8/1994 | Jun | 437/52 |
| 5,366,917 | 11/1994 | Watanabe et al. | 437/47 |
| 5,385,863 | 1/1995 | Tatsumi et al. | 437/109 |
| 5,429,972 | 7/1995 | Anjum et al. | 437/47 |
| 5,691,249 | 11/1997 | Watanabe et al. | 438/398 |
| 5,837,569 | 11/1998 | Makita et al. | 438/166 |
| 5,837,580 | 11/1998 | Thakur et al. | 438/255 |

OTHER PUBLICATIONS

Joubert, P., et al., "The Effect of Low Pressure on the Structure of LPCVD Polycrystalline Silicon Films", Journal of the Electrochemical Society, 134 (10), 2541–45, Oct. 1987.

Sakai et al., "Novel Seeding Method for the Growth of Polycrystalline Si Films With Hemispherical Grains", Applied Physics LEtters, vol. 61, No. 2, 13 Jul. 1992. pp. 159–161.

Watanabe et al., "Hemispherical Grained Si Formation on *in–situ* Phosphorous Doped Amorphous–Si Electrode for 256 Mb DRAM Capacitor", IEEE Electronic Devices Society Publication, vol. 42, No. 7, pp. Jul., 1995, 1247–1254.

*Primary Examiner*—Benjamin Utech
*Assistant Examiner*—Donald L. Champagne
*Attorney, Agent, or Firm*—Wells, St. John, Roberts Gregory & Matkin P.S.

[57] ABSTRACT

A method of forming a silicon layer having a roughened outer surface includes, a) providing a substantially amorphous silicon layer over a substrate, the amorphous silicon layer having an outer surface; b) providing a seeding layer over the amorphous silicon layer outer surface; and c) annealing the amorphous silicon layer and seeding layer under temperature and pressure conditions effective to transform said amorphous layer into a silicon layer having a roughened outer surface. The amorphous silicon layer is preferably provided by providing a first silicon source gas (i.e., silane) within a chemical vapor deposition reactor under first reactive temperature and pressure conditions effective to deposit a substantially amorphous first silicon layer on the substrate. After the amorphous silicon layer deposition, a second silicon source gas (i.e., silane) is provided within the chemical vapor deposition reactor under second reactive temperature and pressure conditions effective to deposit a seeding second layer of polysilicon on the amorphous first silicon layer, the second reactive conditions also being effective to maintain the first silicon layer substantially amorphous during the second silicon layer deposition. Then, the first and second silicon layers are annealed under temperature and pressure conditions effective to transform said amorphous first layer into a silicon layer having a roughened outer surface.

28 Claims, 3 Drawing Sheets

METHOD OF FORMING A SILICON FILM

TECHNICAL FIELD

This invention relates generally to semiconductor processing methods of providing a roughened silicon film, and to capacitor constructions incorporating roughened silicon films.

BACKGROUND OF THE INVENTION

The reduction in memory cell size required for high density dynamic random access memories (DRAMs) results in a corresponding decrease in the area available for the storage node of the memory cell capacitor. Yet, design and operational parameters determine the minimum charge required for reliable operation of the memory cell despite decreasing cell area. Several techniques have been developed to increase the total charge capacity of the cell capacitor without significantly affecting the cell area. These include structures utilizing trench and stacked capacitors, as well as the utilization of new capacitor dielectric materials having higher dielectric constants.

One common material utilized for the capacitor plates is conductively doped silicon, such as polysilicon. Such material is so utilized because of its compatibility with subsequent high temperature processing, good thermal expansion properties with $SiO_2$, and its ability to be conformally deposited over widely varying topography.

As background, silicon occurs in crystalline and amorphous forms. Further, there are two basic types of crystalline silicon known as monocrystalline silicon and polycrystalline silicon. Polycrystalline silicon, polysilicon for short, is typically in situ or subsequently conductively doped to render the material electrically conductive. Monocrystalline silicon is typically epitaxially grown from a silicon substrate. Silicon films deposited on dielectrics (such as $SiO_2$ and $Si_3N_4$) result in either an amorphous or polycrystalline phase. Specifically, it is generally known within the prior art that silicon deposited at wafer temperatures of less than approximately 580° C. will result in an amorphous silicon layer, whereas silicon deposited at temperatures higher than about 580° C. will result in a polycrystalline layer. The specific transition temperature depends on the source chemicals/precursors used for the deposition.

The prior art has recognized that capacitance of a polysilicon layer can be increased merely by increasing the surface roughness of the polysilicon film that is used as a capacitor storage node. Such roughness is typically transferred to the cell dielectric and overlying polysilicon layer interfaces, resulting in a larger surface area for the same planar area which is available for the capacitor. One procedure utilized to achieve surface roughening involves deposition under conditions which are intended to inherently induce a rough or rugged upper silicon surface. Such include low pressure chemical vapor deposition (LPCVD) techniques. Yet, such techniques are inherently unpredictable or inconsistent in the production of a rugged silicon film.

FIG. 1 illustrates a prior art plot of a silicon deposition process utilizing silane and hydrogen as source gases as a function of deposition pressure and deposition temperature. The upper or far left illustrated line "A" is the interface line between whether the deposition produces amorphous silicon or a mixed phase of crystalline and amorphous silicon. At combination deposition pressures and temperatures falling above or to the left of line "A", the deposited layer will be essentially amorphous. At combination deposition pressures and temperatures falling below or to the right of the line "A" and above and to the left of line "B", the deposition will be mixed phase. The interface line "B" is a boundary between rough versus smooth outer surface silicon of either mixed or crystalline phases. Those deposition pressure and temperature combinations falling between the illustrated lines "A" and "B" produce mixed phase silicon having an inherently rough outer surface. Those deposition pressure and temperature combinations falling to the right or below the illustrated line "B" produce polysilicon films having inherently smooth outer surfaces. Amorphous silicon films deposited to the left or above the line "A" are generally smooth.

The goal for the processor when desiring to deposit a rough polycrystalline film is to fall within or between the two illustrated "A" and "B" lines. Ultimate subsequent wafer processing, which includes heating, will transform such film into rough polysilicon. However, processing control and other parameters can adversely affect the controllability of producing a silicon film falling within the "A" and "B" line boundaries in situ having rough outer surfaces.

The prior art also recognizes that rough polysilicon films can be produced by post-deposition vacuum anneal. Using this method, surface roughness can be induced after a lower capacitor plate electrode is defined by photopatterning and etching. However, such anneal processes require careful surface control and high vacuum leading to difficulties in processing.

Accordingly, it would be desirable to improve upon these and other prior art processes in methods of forming polysilicon layers having roughened outer surfaces.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a method of forming a polysilicon layer comprises:

providing a substantially amorphous silicon layer over a substrate, the amorphous silicon layer having an outer surface;

forming a layer over the amorphous silicon layer; and after forming the layer, annealing the treated amorphous silicon layer under temperature and pressure conditions effective to substantially transform at least an outer portion of said amorphous layer into a polycrystalline silicon layer.

In accordance with another aspect of the invention, a method of forming a silicon layer having a roughened outer surface comprises:

forming a substantially amorphous silicon layer over a substrate, the amorphous silicon layer having an outer surface;

treating the outer surface of amorphous silicon to enhance resultant surface roughness of a polysilicon layer produced from the amorphous silicon layer; and annealing the treated amorphous silicon layer under temperature and pressure conditions effective to substantially transform at least an outer portion of said amorphous layer into a silicon layer having a roughened outer surface.

Figure 2:
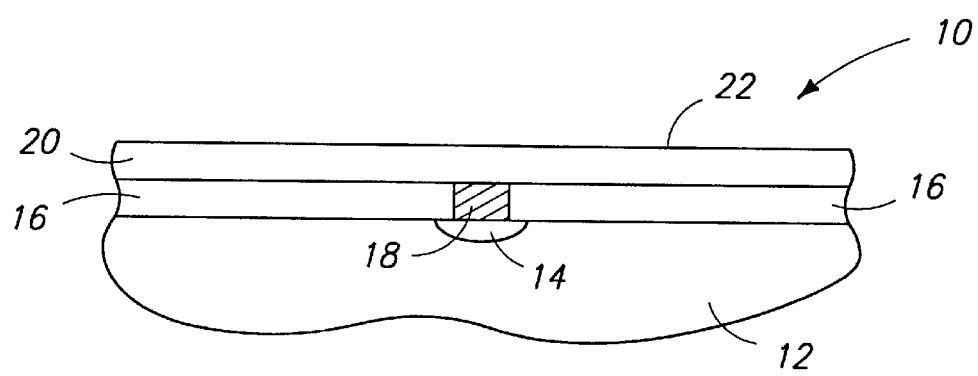
FIG. 2 is a diagrammatic sectional view of a semiconductor wafer fragment at one processing step in accordance with an aspect of the invention.

Referring initially to FIG. 2, a semiconductor wafer fragment in process is indicated generally with reference 10. Such comprises a bulk monocrystalline silicon substrate 12 having a diffusion region 14 provided therein. An electrically insulative layer 16, such as undoped $SiO_2$ or borophosphosilicate glass (BPSG), is provided outwardly of substrate 12. A contact or via plug 18 is provided therethrough to diffusion region 14.

Figure 1:
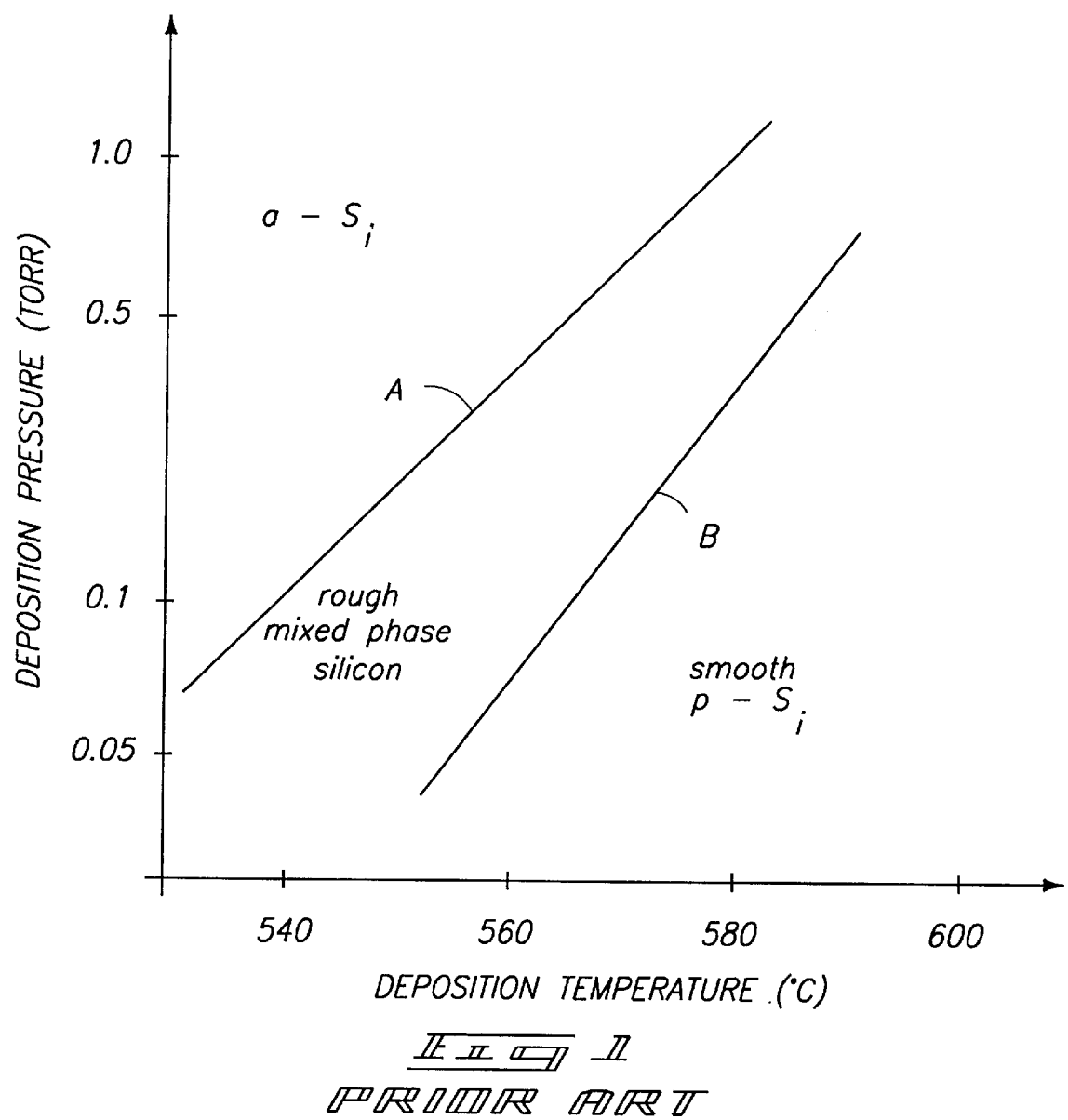
FIG. 1 is a graphical depiction of pressure vs. temperature for a chemical vapor deposition process of depositing silicon on a substrate using $SiH_4$ and $H_2$ as source gases.

Such substrate would be provided within a chemical vapor deposition reactor. A first silicon source gas would be provided to within the chemical vapor deposition reactor under first reactive temperature and pressure conditions effective to deposit a substantially amorphous first silicon layer 20 over substrate 12/16. An example first silicon source gas includes silane gases, such as $SiH_4$, $Si_2H_6$, etc. Where silane source gases are utilized, hydrogen gas is also preferably provided within the reactor. Example reactive temperature, pressure and other conditions effective to produce a substantially amorphous silicon film 20 are within the skills of the artisan, and include those temperature and pressure combination conditions which for example are shown by FIG. 1. In the context of this document, "substantially amorphous" applies to a silicon film being 95% or greater amorphous. For purposes of the continuing discussion, amorphous silicon layer 20 has an outer surface 22 which will typically be comparatively smooth as initially provided.

In one aspect of the invention, outer surface 22 is provided with another layer (i.e. a seeding layer to induce roughness) prior to a surface roughening anneal. In one instance, the anneal can be conducted to substantially transform at least an outer portion of layer 20 into polycrystalline silicon. Alternately, the anneal can be conducted to maintain layer 20 as substantially amorphous, and with a roughened outer surface than before the anneal.

Alternately or in conjunction with provision of such a seeding layer, outer surface 22 of amorphous silicon layer 20 is treated to enhance resultant surface roughness of a polysilicon layer produced from the amorphous silicon layer.

Figure 3:
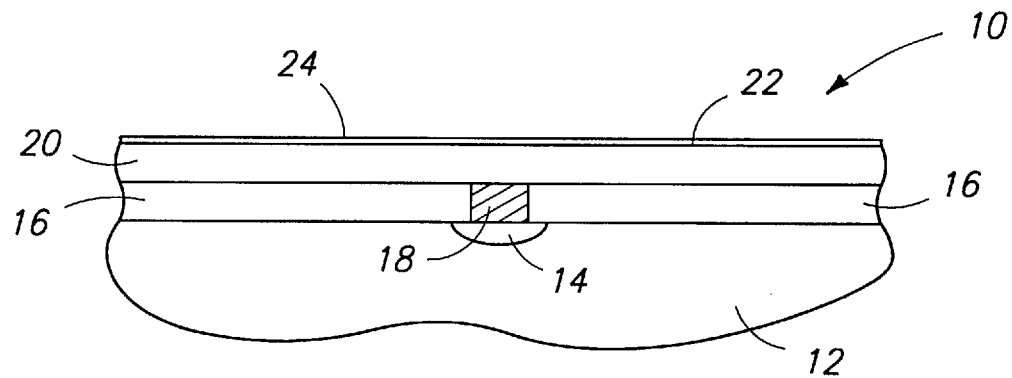
FIG. 3 is a view of the FIG. 2 wafer fragment at a processing step subsequent to that show by FIG. 2.

Most preferably and with reference to FIG. 3, a second silicon source gas is provided within the chemical vapor deposition reactor within which substrate 10 is received under second reactive temperature and pressure conditions effective to deposit a polysilicon crystallization seeding second layer 24 over amorphous first silicon layer outer surface 22. The second reactive conditions are also chosen to be effective to maintain first silicon layer 20 substantially amorphous during second silicon layer 24 deposition. The second silicon source gas might be the same as, or different than, the first silicon source gas. Such provides but one example of a surface 22 treatment in accordance with the invention.

Layer 24 is preferably deposited to a thickness of less than or equal to about 200 Angstroms, and even more preferably to a thickness of less than or equal to about 50 Angstroms over amorphous silicon layer 20. Preferably, the pressure of the second reactive conditions is selected to be less than that of the first reactive conditions to more carefully assure that the deposition will not result in substantial crystallization of first layer 20 during second layer 24 deposition. Further preferably, the temperature of the second reactive conditions is also chosen to be less than that of the first reactive conditions for the same reason.

Layer 24 in the preferred embodiment constitutes a crystallization seeding layer for ultimate transformation of composite silicon layers 24 and 22 to polycrystalline silicon, as will be apparent from the continuing discussion. Most preferably, layer 24 comprises polysilicon or some other material which is substantially crystalline is deposited. Other materials are also contemplated, with the invention only being limited by the accompanying claims appropriately interpreted in accordance with the doctrine of equivalents. One other such example includes $SiO_2$.

Figure 4:
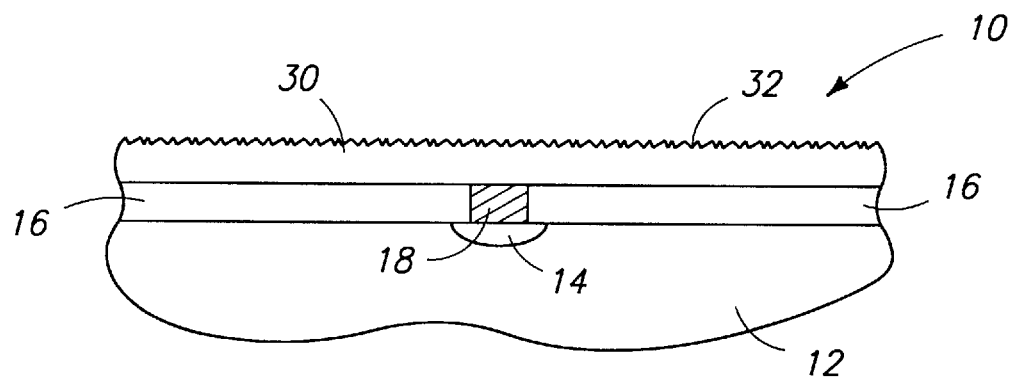
FIG. 4 is a view of the FIG. 2 wafer fragment at a processing step subsequent to that show by FIG. 3.

Referring to FIG. 4, amorphous silicon layer 20 and seeding layer 24 are annealed under temperature and pressure conditions effective to substantially transform at least an outer portion of amorphous layer 20 into a silicon layer 30 having a roughened outer surface 32. Example annealing temperature and pressure conditions include $10^{-3}$–$10^{-7}$ Torr and 600° C.–900° C., utilizing Ar, He or $H_2$ as annealing gases. Outer surface 32 of layer 30 will be rougher than initial outer surface 22 of amorphous layer 20 as-deposited, thereby providing a roughened outer surface 32. The outer portion of layer 30 20 is preferably transformed to polycrystalline silicon during such conditions. A mixed phase might alternately result.

Figure 5:
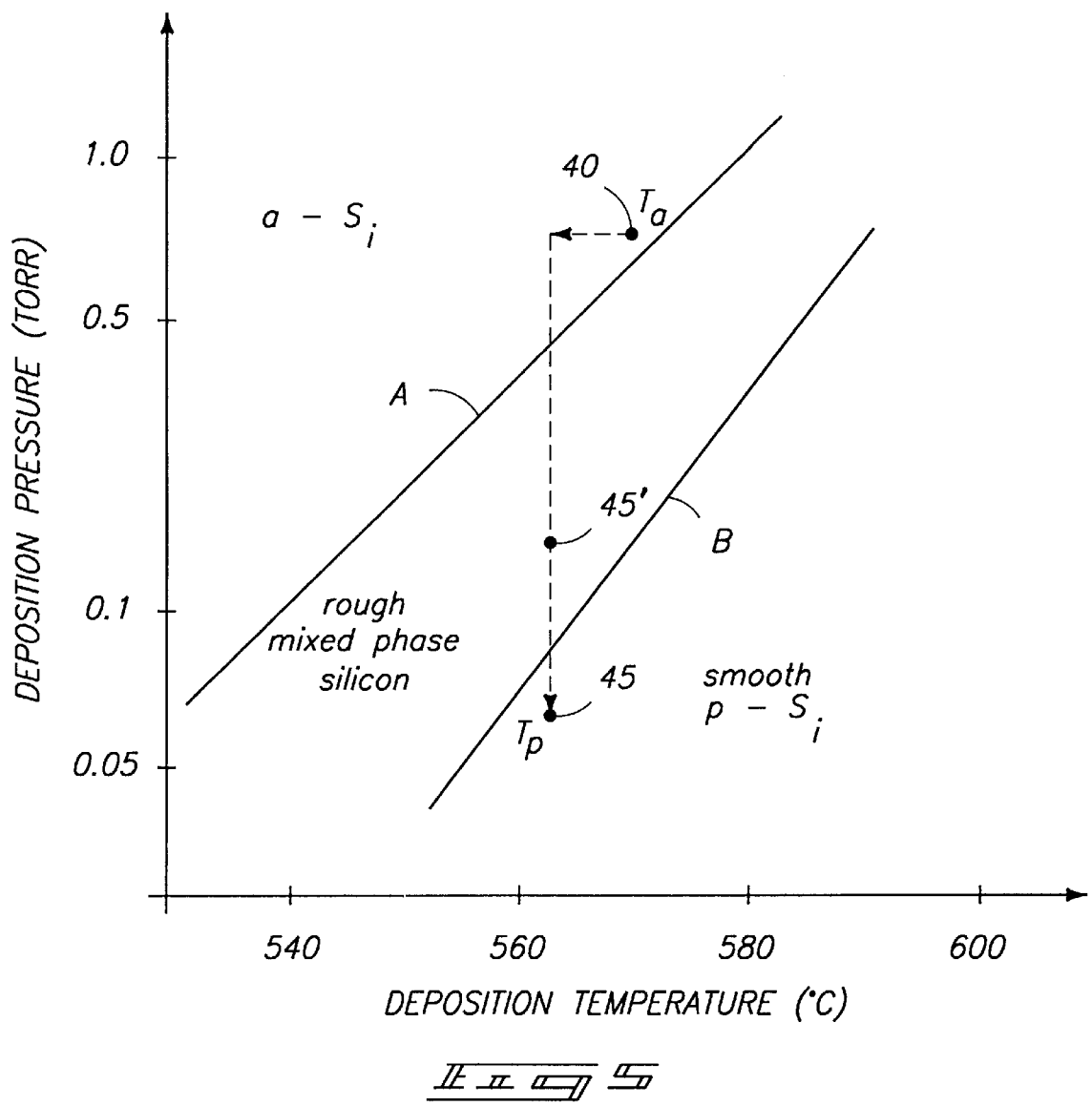
FIG. 5 is a graphical depiction of pressure vs. temperature for a chemical vapor deposition process in accordance with an aspect of the invention.

FIG. 5 diagrammatically illustrates example preferred processing whereby layer 20 is deposited at temperature and pressure conditions 40, whereas layer 24 is deposited at temperature and pressure conditions 45 or 45'. Preferred deposition in accordance with the example FIG. 5 processing parameters minimizes or eliminates formation of crystallites in amorphous silicon film 20 which might otherwise interfere with surface roughening crystallization during subsequent anneal.

Figure 6:
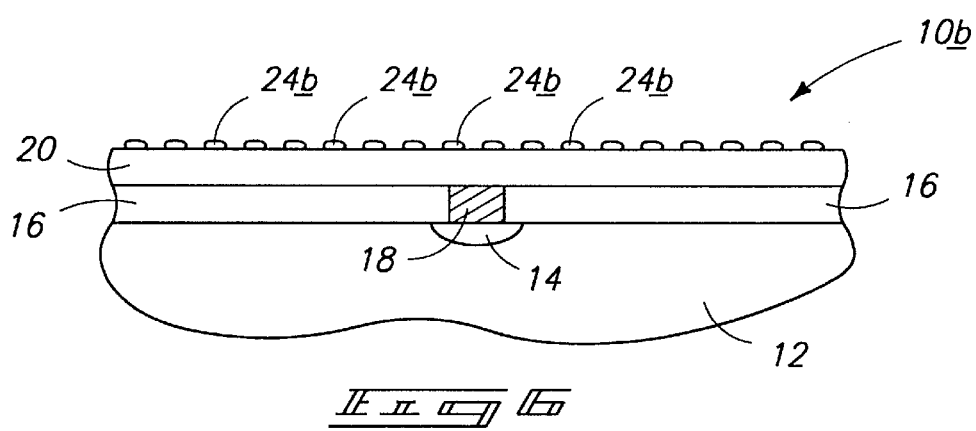
FIG. 6 is a diagrammatic sectional view of an alternate embodiment semiconductor wafer fragment at another processing step in accordance with an aspect of the invention.

FIG. 6 illustrates an alternate and somewhat even more preferred embodiment. Like numerals from the first described embodiment are utilized where appropriate, with differences being indicated by the suffix "b" or with different numerals. In this embodiment, layer 24b is deposited in a manner which produces a discontinuous layer 24b, as opposed to the continuous depicted layer in the first described embodiment. Process conditions for depositing a discontinuous layer 24b of poly or mixed phase silicon includes those as described above, but for a very short period of time to avoid formation of a continuous layer.

The phenomenon giving rise to roughness in an outer silicon film, preferably substantially polysilicon, is surmised to be crystallization of amorphous silicon from the outer surface as opposed to starting from within the bulk amorphous silicon. A thin surface seeding layer can act like nucleation centers on the surface which upon anneal propagate rough outer surface generation from the ensuing crystallization. Alternate treatment techniques for the outer surface of the amorphous silicon layer prior to crystallization anneal are also contemplated.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A method of forming a silicon layer having a roughened outer surface comprising the following steps:

forming a substantially amorphous silicon layer over a substrate, the amorphous silicon layer having an outer surface;

forming a seeding layer over the amorphous silicon layer outer surface; and annealing the amorphous silicon layer and seeding layer under temperature and pressure conditions effective to substantially transform at least an outer portion of said amorphous layer into a silicon layer having a roughened outer surface.

2. The method of forming a roughened silicon layer of claim 1 wherein the annealing is conducted under conditions effective to substantially transform said outer portion into polysilicon having a roughened outer surface.

3. The method of forming a roughened silicon layer of claim 1 wherein the seeding layer is provided to a thickness of less than or equal to about 200 Angstroms over the amorphous silicon layer.

4. The method of forming a roughened silicon layer of claim 1 wherein the seeding layer is provided to a thickness of less than or equal to about 50 Angstroms over the amorphous silicon layer.

5. The method of forming a roughened silicon layer of claim 1 wherein the seeding layer is discontinuous over the amorphous silicon layer.

6. The method of forming a roughened silicon layer of claim 1 wherein the seeding layer is substantially crystalline.

7. The method of forming a roughened silicon layer of claim 1 wherein the seeding layer comprises polycrystalline or mixed phase silicon.

8. The method of forming a roughened silicon layer of claim 1 wherein the seeding layer comprises silicon dioxide.

9. The method of forming a roughened silicon layer of claim 1 wherein the seeding layer is provided under a temperature condition which is less than that under which the amorphous silicon layer is formed.

10. The method of forming a roughened silicon layer of claim 1 wherein the seeding layer is provided under a pressure condition which is less than that under which the amorphous silicon layer is formed.

11. The method of forming a roughened silicon layer of claim 1 wherein the seeding layer is provided under both temperature and pressure conditions which are less than those under which the amorphous silicon layer is formed.

12. A method of forming a silicon layer having a roughened outer surface comprising the following steps:

forming a substantially amorphous silicon layer over a substrate, the amorphous silicon layer having an outer surface;

forming a seeding layer over the amorphous silicon layer outer surface to a thickness of less than or equal to about 50 Angstroms and under a temperature condition which is less than that under which the amorphous silicon layer is provided; and annealing the amorphous silicon layer and seeding layer under temperature and pressure conditions effective to substantially transform at least an outer portion of said amorphous layer into a silicon layer having a roughened outer surface.

13. The method of forming a roughened silicon layer of claim 12 wherein the annealing is conducted under conditions effective to substantially transform said outer portion into polysilicon having a roughened outer surface.

14. The method of forming a roughened silicon layer of claim 12 wherein the seeding layer is discontinuous over the amorphous silicon layer.

15. A method of forming a silicon layer having a roughened outer surface comprising the following steps:

providing a first silicon source gas within a chemical vapor deposition reactor, having a substrate positioned therein, under first reactive temperature and pressure conditions effective to deposit a substantially amorphous first silicon layer on the substrate;

after the amorphous silicon layer deposition, providing a second silicon source gas within the chemical vapor deposition reactor under second reactive temperature and pressure conditions effective to deposit a seeding second layer of polysilicon on the amorphous first silicon layer, the second reactive conditions also being effective to maintain the first silicon layer substantially amorphous during the second polysilicon layer deposition; and annealing the first and second layers under temperature and pressure conditions effective to substantially transform at least an outer portion of said amorphous first layer into a silicon layer having a roughened outer surface.

16. The method of forming a roughened silicon layer of claim 15 wherein the annealing is conducted under conditions effective to substantially transform said outer portion into polysilicon having a roughened outer surface.

17. The method of forming a roughened silicon layer of claim 15 wherein the pressure of the second reactive conditions is less than that of the first reactive conditions.

18. The method of forming a roughened silicon layer of claim 15 wherein the second silicon source gas is the same as the first silicon source gas.

19. The method of forming a roughened silicon layer of claim 15 wherein the second silicon source gas is different than the first silicon source gas.

20. The method of forming a roughened silicon layer of claim 15 wherein the temperature of the second reactive conditions is less than that of the first reactive conditions.

21. The method of forming a roughened silicon layer of claim 15 wherein both the pressure and temperature of the second reactive conditions are less than those of the respective first reactive conditions.

22. The method of forming a roughened silicon layer of claim 15 wherein the second polysilicon layer is discontinuous over the first silicon layer.

23. A method of forming a silicon layer having a roughened outer surface comprising the following steps:

providing a first silane source gas and hydrogen within a chemical vapor deposition reactor, having a substrate positioned therein, under first reactive temperature and pressure conditions effective to deposit a substantially amorphous first silicon layer on the substrate;

after the amorphous silicon layer deposition, providing a second silane source gas and hydrogen within the chemical vapor deposition reactor under second reactive temperature and pressure conditions effective to deposit a seeding second layer of polysilicon on the amorphous first silicon layer, the second reactive conditions also being effective to maintain the first silicon layer substantially amorphous during the second silicon layer deposition; and annealing the first and second layers under temperature and pressure conditions effective to substantially transform at least an outer portion of said amorphous first layer into a silicon layer having a roughened outer surface.

24. The method of forming a roughened silicon layer of claim 23 wherein the first silane source gas is $SiH_4$ and the second source gas is $Si_2H_6$.

25. The method of forming a roughened silicon layer of claim 23 wherein the first and second silane source gases are $SiH_4$.

26. The method of forming a roughened silicon layer of claim 23 wherein the second polysilicon layer is discontinuous over the first silicon layer.

27. A method of forming a silicon layer having a roughened outer surface comprising the following steps:

providing a first silicon source gas within a chemical vapor deposition reactor, having a substrate positioned therein, under first reactive temperature and pressure conditions effective to deposit a substantially amorphous first silicon layer on the substrate;

after the amorphous silicon layer deposition, providing a second silicon source gas within the chemical vapor deposition reactor under second temperature and pressure conditions effective to treat the first silicon layer, the second conditions also being effective to maintain the first silicon layer substantially amorphous; and annealing the treated first layer under temperature and pressure conditions effective to substantially transform at least an outer portion of said amorphous first layer into a silicon layer having a roughened outer surface.

28. A method of forming a silicon layer having a roughened outer surface comprising the following steps:

providing a first silane source gas and hydrogen within a chemical vapor deposition reactor, having a substrate positioned therein, under first reactive temperature and pressure conditions effective to deposit a substantially amorphous first silicon layer on the substrate;

after the amorphous silicon layer deposition, providing a second silane source gas and hydrogen within the chemical vapor deposition reactor under second temperature and pressure conditions effective to treat the first silicon layer, the second conditions also being effective to maintain the first silicon layer substantially amorphous; and annealing the treated first layer under temperature and pressure conditions effective to substantially transform at least an outer portion of said amorphous first layer into a silicon layer having a roughened outer surface.

* * * * *

UNITED STATES PATENT AND TRADEMARK OFFICE
CERTIFICATE OF CORRECTION

PATENT NO.    : 5,888,295
DATED         : March 30, 1999
INVENTOR(S)   : Gurtej S. Sandhu and Randhir P.S. Thakur It is certified that error appears in the above-identified patent and that said Letters Patent are hereby corrected as shown below:

Column 4, line 32, delete the number "20".

Signed and Sealed this

Twenty-first Day of September, 1999

Attest:

Q. TODD DICKINSON

*Attesting Officer*    Acting Commissioner of Patents and Trademarks